United States Patent
Liu (10) Patent No.: US 9,502,527 B2
(45) Date of Patent: Nov. 22, 2016

(54) SEMICONDUCTOR DEVICE STRUCTURE HAVING MULTI-LAYERED INSULATING CAP LAYERS OVER METAL GATE

(71) Applicant: Taiwan Semiconductor Manufacturing Co., Ltd, Hsin-Chu (TW)

(72) Inventor: Yung-Tsun Liu, Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 14/273,994

(22) Filed: May 9, 2014

(65) Prior Publication Data

US 2015/0325690 A1  Nov. 12, 2015

(51) Int. Cl.
*H01L 29/66* (2006.01)
*H01L 29/78* (2006.01)
*H01L 21/3105* (2006.01)
*H01L 21/265* (2006.01)
*H01L 29/51* (2006.01)
*H01L 29/165* (2006.01)
*H01L 21/285* (2006.01)
*H01L 21/768* (2006.01)

(52) U.S. Cl.
CPC ..... *H01L 29/66545* (2013.01); *H01L 21/3105* (2013.01); *H01L 21/31053* (2013.01); *H01L 21/76831* (2013.01); *H01L 29/66553* (2013.01); *H01L 29/66636* (2013.01); *H01L 29/66871* (2013.01); *H01L 29/78* (2013.01); *H01L 29/7834* (2013.01); *H01L 29/7848* (2013.01); *H01L 21/26506* (2013.01); *H01L 21/28518* (2013.01); *H01L 21/76814* (2013.01); *H01L 29/165* (2013.01); *H01L 29/517* (2013.01); *H01L 29/665* (2013.01)

(58) Field of Classification Search
None
See application file for complete search history.

(56) References Cited

U.S. PATENT DOCUMENTS

| | | | |
|---|---|---|---|
| 2011/0298061 A1* | 12/2011 | Siddiqui et al. | 257/410 |
| 2012/0139061 A1* | 6/2012 | Ramachandran . | H01L 21/76895 257/410 |
| 2013/0049123 A1* | 2/2013 | Baars | H01L 27/10891 257/368 |
| 2014/0030880 A1 | 1/2014 | Liang et al. | |
| 2014/0035010 A1* | 2/2014 | Cai et al. | 257/288 |

(Continued)

*Primary Examiner* — Michael Jung
(74) *Attorney, Agent, or Firm* — Birch, Stewart, Kolasch & Birch, LLP (57) ABSTRACT

A semiconductor device structure is provided. The semiconductor device structure includes a semiconductor substrate. The semiconductor device structure further includes a gate stack over the semiconductor substrate. The gate stack includes a gate dielectric layer, a metal gate over the gate dielectric layer, a first insulating layer over the metal gate and a second insulating layer over the first insulating layer. Materials of the first insulating layer and the second insulating layer are different. The semiconductor device structure also includes spacers over opposite sidewalls of the gate stack. The spacers and the metal gate surround a recess, and the first insulating layer and the second insulating layer are in the recess.

20 Claims, 7 Drawing Sheets

(56) References Cited

U.S. PATENT DOCUMENTS

2014/0070333 A1\* 3/2014 Cheng ............... H01L 21/28079
                                                        257/411
2014/0154877 A1\* 6/2014 Besser et al. ................. 438/586
2014/0264486 A1\* 9/2014 Pham et al. .................. 257/288
2015/0097252 A1\* 4/2015 Flachowsky et al. ........ 257/410
2015/0214220 A1\* 7/2015 Seo ....................... H01L 27/088
                                                        257/392
2015/0340456 A1\* 11/2015 Yin ................... H01L 21/28114
                                                        257/288

\* cited by examiner

SEMICONDUCTOR DEVICE STRUCTURE HAVING MULTI-LAYERED INSULATING CAP LAYERS OVER METAL GATE

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling down process generally provides benefits by increasing production efficiency and lowering, associated costs.

However, since the feature sizes continue to decrease, fabrication processes continue to become more difficult to perform. The fabrication processes are photolithography processes, alignment processes, gap-filling processes, etching processes, or the like. Therefore, it is a challenge to form reliable semiconductor devices with smaller and smaller sizes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It is understood that additional operations can be provided before, during, and after the method, and some of the operations described can be replaced or eliminated for other embodiments of the method.

Figure 1A:
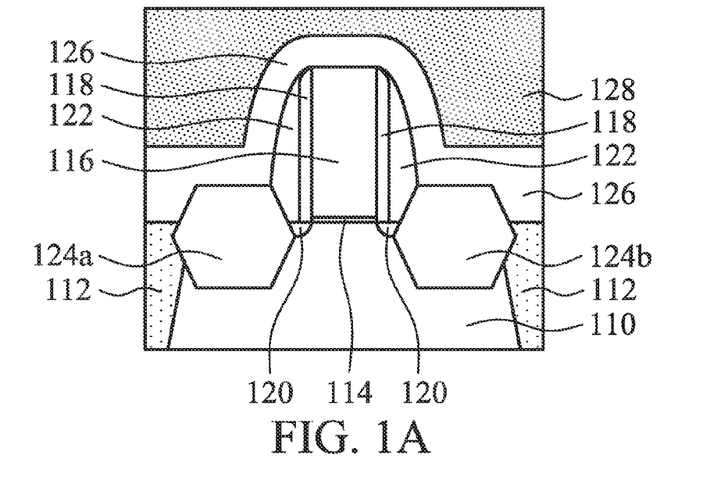
FIGS. 1A-1M are cross-sectional views of various stages of a process for forming a semiconductor device structure, in accordance with some embodiments.

FIGS. 1A-1M are cross-sectional views of various stages of a process for forming a semiconductor device structure 100, in accordance with some embodiments. As shown in FIG. 1A, a semiconductor substrate 110 is provided. The semiconductor substrate 110 may be a semiconductor wafer (such as a silicon wafer) or a portion of a semiconductor wafer.

In some embodiments, the semiconductor substrate 110 is made of an elementary semiconductor material including silicon or germanium in a single crystal, polycrystal, or amorphous structure. In some other embodiments, the semiconductor substrate 110 is made of a compound semiconductor, such as silicon carbide, gallium arsenide, gallium phosphide, indium phosphide, indium arsenide, an alloy semiconductor, such as SiGe, or GaAsP, or a combination thereof. In some embodiments, the semiconductor substrate 110 includes multi-layer semiconductors, semiconductor on insulator (SOI) (such as silicon on insulator or germanium on insulator), or a combination thereof.

As shown in FIG. 1A, an isolation structure 112 is formed in the semiconductor substrate 110 to define various active regions in the semiconductor substrate 110, in accordance with some embodiments. The isolation structure 112 is used to electrically isolate neighboring devices (e.g. transistors) from one another.

In some embodiments, the isolation structure 112 is made of a dielectric material, such as silicon oxide, silicon nitride, silicon oxynitride, fluoride-doped silicate glass (FSG), a low-K dielectric material, other suitable materials, or combinations thereof. In some embodiments, the isolation structure 112 is formed by using an isolation technology, such as local oxidation of semiconductor (LOCOS), shallow trench isolation (STI), or the like.

In some embodiments, the formation of the isolation structure 112 includes patterning the semiconductor substrate 110 by a photolithography process, etching a trench in the semiconductor substrate 110 (for example, by using a dry etching, wet etching, plasma etching process, or combinations thereof), and filling the trench (for example, by using a chemical vapor deposition process) with the dielectric material. In some embodiments, the filled trench has a multi-layer structure, such as a thermal oxide liner layer filled with silicon nitride or silicon oxide. However, in some embodiments, the isolation structure 112 is not formed.

As shown in FIG. 1A, a gate dielectric layer 114 and a dummy gate 116 are formed over the semiconductor substrate 110, in accordance with some embodiments. A gate-last approach or replacement-gate (RPG) approach will be subsequently performed to form a metal gate. The dummy gate 116 may be made of polysilicon.

In some embodiments, the gate dielectric layer 114 is made of, for example, a high dielectric constant (high-k) material. The high-k material is made of, for example, hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), other suitable high-k dielectric materials, or a combination thereof.

The high-k material is made of, for example, metal oxides, metal nitrides, metal silicates, transition metal-oxides, transition metal-nitrides, transition metal-silicates, oxynitrides of metals, aluminum oxide, hafnium dioxide-alumina (HfO$_2$—Al$_2$O$_3$) alloy, other suitable materials, or combinations thereof.

The gate dielectric layer 114 is deposited by any suitable process, such as atomic layer deposition (ALD), chemical vapor deposition (CVD), physical vapor deposition (PVD), sputtering, plating, other suitable processes, or combinations thereof. In some embodiments, the gate dielectric layer 114 is further annealed.

An intermediate dielectric layer (not shown) may be formed over the semiconductor substrate 110 before the gate dielectric layer 114 is formed. The intermediate dielectric layer may be made of a suitable dielectric material, such as silicon oxide, hafnium silicate, silicon oxynitride, or combinations thereof.

As shown in FIG. 1A, a sealing layer 118 is formed over sidewalls of the dummy gate 116 and the gate dielectric layer 114, in accordance with some embodiments. The sealing layer 118 is configured to protect the gate dielectric layer 114 and the dummy gate 116 from damage during subsequent processes, in accordance with some embodiments.

The sealing layer 118 includes a dielectric material such as silicon nitride (SiNx), silicon oxide (SiOx), silicon oxynitride (SiON), silicon carbide (SiC), silicon (Si), silicon germanium (SiGe), other suitable materials, or a combination thereof. The sealing layer 118 is formed by a deposition process (such as a chemical vapor deposition process) and an etching process, in accordance with some embodiments.

As shown in FIG. 1A, doped regions 120 are formed in the semiconductor substrate 110 and near two opposite sides of the dummy gate 116, in accordance with some embodiments. The doped regions 120 are a lightly doped source region and a lightly doped drain region, which are formed after the sealing layers 118 are formed, in accordance with some embodiments. The doped regions 120 are formed by using a suitable process, such as an ion implantation process.

As shown in FIG. 1A, spacers 122 are formed over the sealing layers 118 in accordance with some embodiments. The spacers 122 are made of a dielectric material, such as silicon nitride layer, silicon oxynitride layer, or combinations thereof, in accordance with some embodiments. The spacers 122 are formed by a deposition process (such as a chemical vapor deposition process) and an etching process, in accordance with some embodiments.

As shown in FIG. 1A, a source stressor region 124a and a drain stressor region 124b are formed in the semiconductor substrate 110, in accordance with some embodiments. The source stressor region 124a and the drain stressor region 124b are adjacent to the spacers 122, in accordance with some embodiments. In some embodiments, the source stressor region 124a and the drain stressor region 124b are formed by using an etching process for removing a portion of the semiconductor substrate 110 and a selective epitaxial growth (SEG) process.

The source stressor region 124a and the drain stressor region 124b are also referred to as a source region and a drain region. The source stressor region 124a and the drain stressor region 124b include SiGe, SiC or other suitable materials, in accordance with some embodiments. In some embodiments, the source stressor region 124a and the drain stressor region 124b are used to provide strain or stress to the channel region under the gate dielectric layer 114 so as to increase the carrier mobility.

In some embodiments, the source stressor region 124a and the drain stressor region 124b are simultaneously doped during their growth or formation. Alternatively, a subsequent implantation process is performed to dope the source stressor region 124a and the drain stressor region 124b. In some embodiments, however, the source stressor region 124a and the drain stressor region 124b are not formed.

A contact. etch stop layer 126 is formed over the semiconductor substrate 110, the source stressor region 124a, the drain stressor region 124b and the dummy gate 116, in accordance with some embodiments. The contact etch stop layer 126 is made of a dielectric material, such as silicon nitride, in accordance with some embodiments. However, in some embodiments, the contact etch stop layer 126 is not formed.

As shown in FIG. 1A, a dielectric layer 128 is then deposited over the semiconductor substrate 110, in accordance with some embodiments. The dielectric layer 128 surrounds the spacers 122, in accordance with some embodiments. The dielectric layer 128 are made of a suitable dielectric material, such as silicon oxide, silicon oxynitride, borosilicate glass (BSG), phosphoric silicate glass (PSG), borophosphosilicate glass (BPSG), fluorinated silicate glass (FSG), low-k material, porous dielectric material, or combinations thereof, in accordance with some embodiments. In some embodiments, the dielectric layer 128 is deposited by using a CVD process, HDPCVD process, spin-on process, sputtering process, another applicable process, or a combination thereof.

Figure 1B:
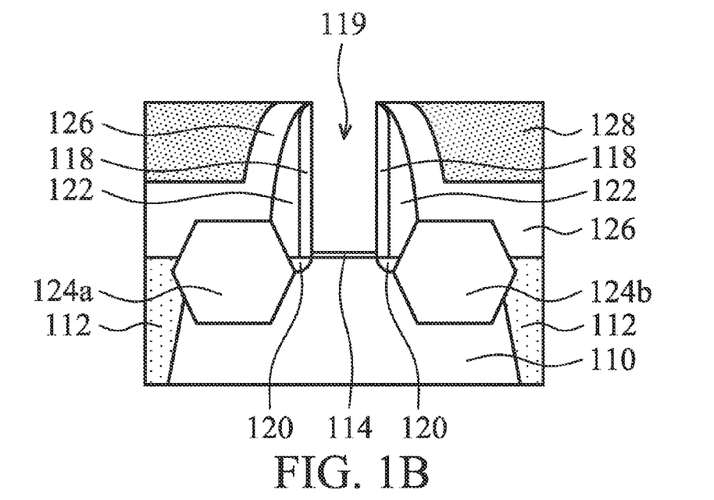

Afterwards, as shown in FIG. 1B, a planarization process is performed to the dielectric layer 128 until a top surface of the dummy gate 116 is exposed. The planarization process includes, for example, a chemical mechanical polishing (CMP) process or the like. After the planarization process is performed, the dielectric layer 128 has a substantially planar surface to facilitate subsequent process operations.

Afterwards, as shown in FIG. 1B, the dummy gate 116 is removed, in accordance with some embodiments. The dummy gate 116 is removed by using, for example, a wet etching process, a dry etching process, or a combination thereof. After the dummy gate 116 is removed, an opening 119 is formed between the spacers 122. In some embodiments, the opening 119 is a trench.

As shown in FIG. 1B, in some embodiments, after the dummy gate 116 is removed, the gate dielectric layer 114 is remained. Alternatively, in some other embodiments (not shown), the gate dielectric layer 114 serves as a dummy gate dielectric layer and is removed in a subsequent process.

Figure 1C:
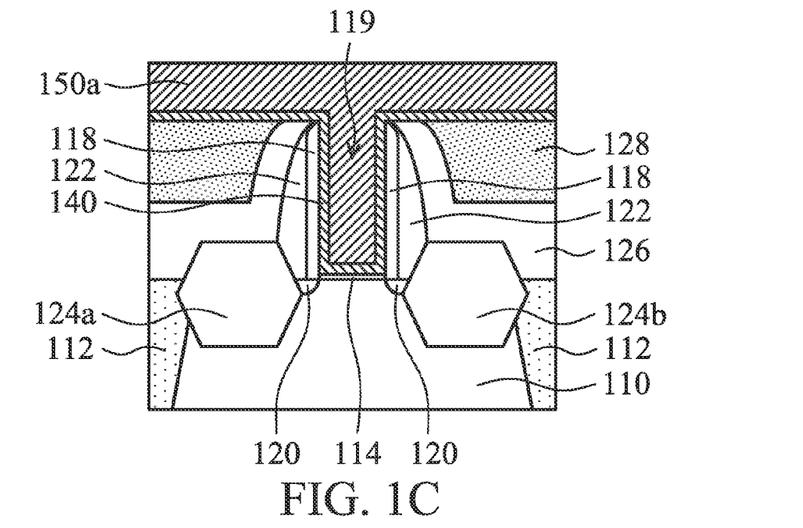

As shown in FIG. 1C, a work function metal layer 140 is deposited over the dielectric layer 128 and the gate dielectric layer 114 in the opening 119, in accordance with some embodiments. The work function metal layer 140 provides a desired work function for transistors to enhance device performance including improved threshold voltage.

In the embodiments of forming an NMOS transistor, the work function metal layer 140 can be an n-type metal capable of providing a work function value suitable for the device, such as equal to or less than about 4.5 eV. The n-type metal may be made of metal, metal carbide, metal nitride, or combinations thereof. For example, the n-type metal is made of tantalum, tantalum nitride, or combinations thereof.

On the other hand, in the embodiments of forming a PMOS transistor, the work function metal layer 140 can be a p-type metal capable of providing a work function value suitable for the device, such as equal to or greater than about 4.8 eV. The p-type metal may be made of metal, metal carbide, metal nitride, other suitable materials, or combinations thereof. For example, the p-type metal is made of titanium, titanium nitride, other suitable materials, or combinations thereof.

In some embodiments, the work function metal layer 140 is made of hafnium, zirconium, titanium, tantalum, aluminum, metal carbides (e.g., hafnium carbide, or zirconium carbide), aluminides, ruthenium or combinations thereof. In some embodiments, the work function metal layer 140 is deposited by using a PVD process, CVD process, ALD process, plating process, another suitable method, or combinations thereof.

A gate electrode layer 150a (also called a metal gate electrode layer) is deposited over the semiconductor substrate 110 and the work function metal layer 140 to fill the opening 119, in accordance with some embodiments. The gate electrode layer 150a is made of a suitable metal material, such as aluminum, tungsten, gold, platinum, cobalt, other suitable metal, alloy thereof, or combinations thereof, in accordance with some embodiments. The gate electrode layer 150a is deposited by using a PVD process, CVD process, plating process, the like, combinations thereof or other suitable deposition processes.

Figure 1D:
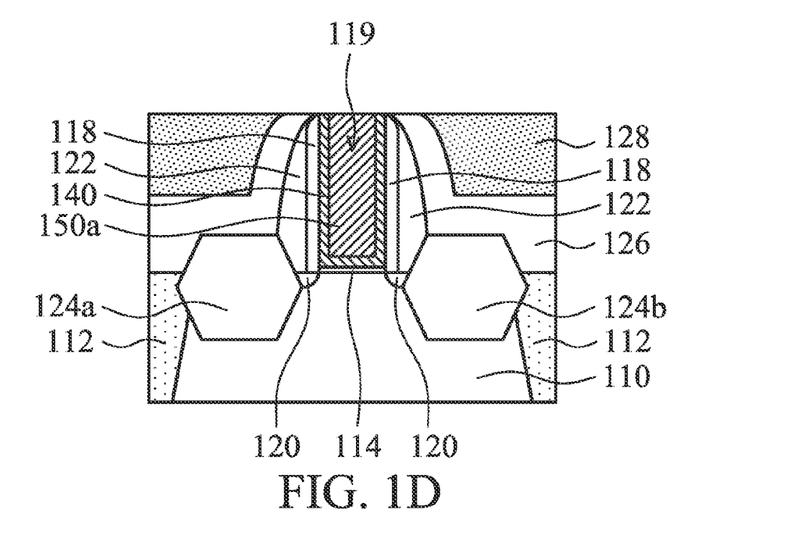

Afterwards, as shown in FIG. 1D, a planarization process is performed to remove the gate electrode layer 150a and the work function metal layer 140 outside of the opening 119, in accordance with some embodiments. The planarization process includes, for example, a chemical mechanical polishing (CMP) process or the like.

Figure 1E:
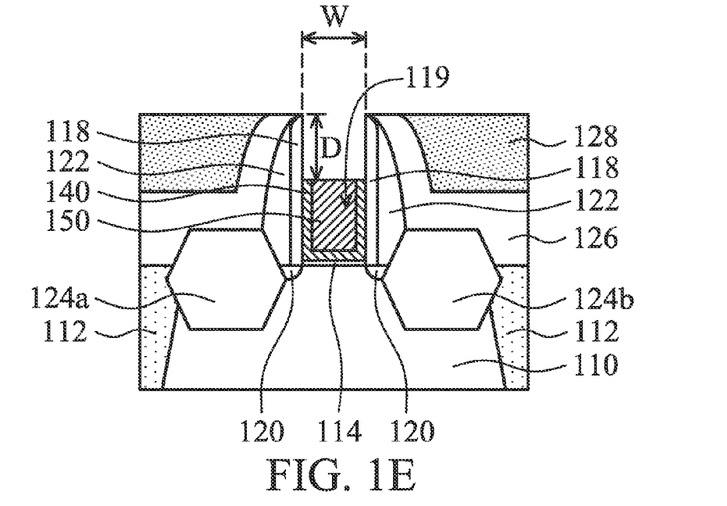

Thereafter, as shown in FIG. 1E, a portion of the gate electrode layer 150a and a portion of the work function metal layer 140 in the opening 119 are removed, in accordance with some embodiments. The removal process includes, for example, an etching process. The gate electrode layer 150a remaining in the opening 119 forms a metal gate 150.

After the removal process, a recess 119a is formed. The recess 119a is surrounded by the spacers 122 and the metal gate 150, in accordance with some embodiments. In some embodiments, a depth D of the recess 119a is larger than or equal to a width W of the recess 119a. The aspect ratio (D/W) of the recess 119a is in a range from about 1 to about 3, in accordance with some embodiments.

Figure 1F:
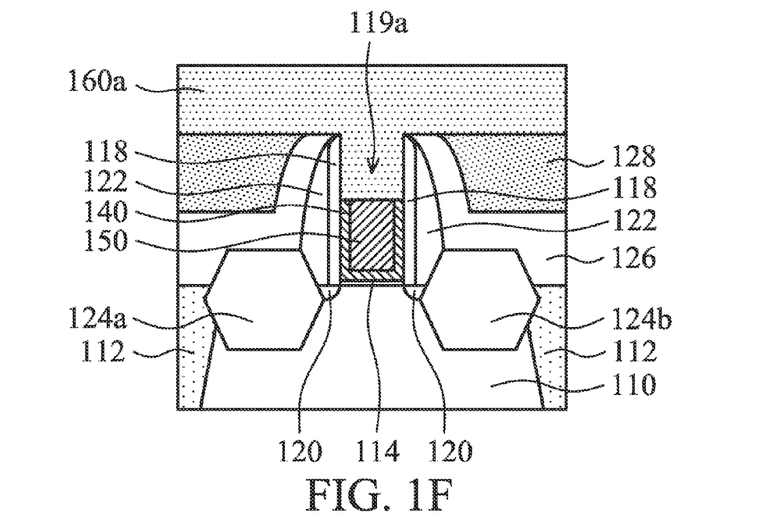

Afterwards, as shown in FIG. 1F, a first insulating material layer 160a is deposited over the semiconductor substrate 110 to fill the recess 119a, in accordance with some embodiments. The first insulating material layer 160a includes an insulating material with a high gap-fill ability. The first insulating material layer 160a includes an oxide material (e.g., silicon oxide) or other suitable insulating materials. The first insulating material layer 160a is deposited by a chemical vapor deposition process, such as a flowable chemical vapor deposition (FCVD) process, in accordance with some embodiments.

Figure 1G:
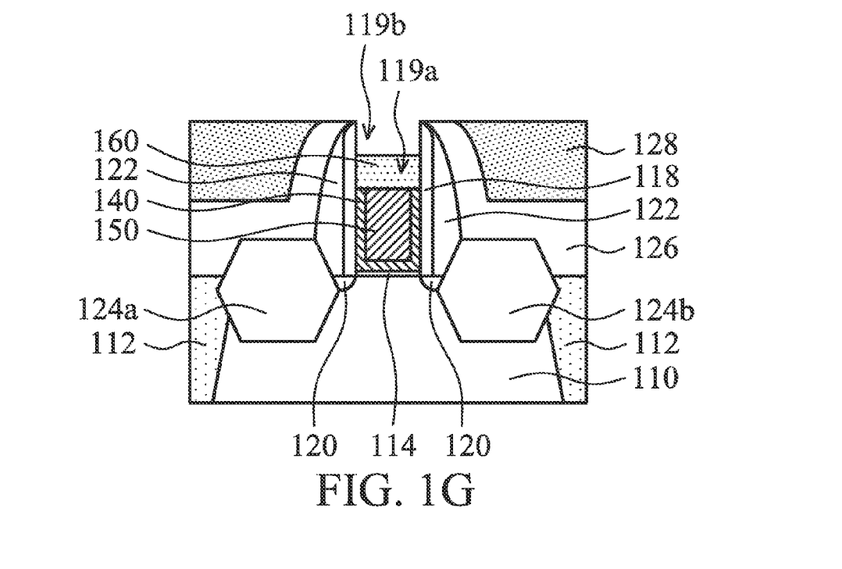

Thereafter, as shown in FIG. 1G, the first insulating material layer 160a outside of the recess 119a and a portion of the first insulating material layer 160a in the recess 119a are removed. The first insulating material layer 160a remaining in the recess 119a forms a first insulating layer 160. After the removal process, a recess 119b is formed. The recess 119b is surrounded by the spacers 122 and the first insulating layer 160.

The recess 119a is not completely filled with the first insulating layer 160. The first insulating layer 160 is in direct contact with the metal gate 150, in accordance with some embodiments. The removal process includes an etching process, such as a dry etching process or a wet etching process, in accordance with some embodiments. The dry etching process uses an etching gas including $CF_4$ and/or $NF_3$, in accordance with some embodiments.

Figure 1H:
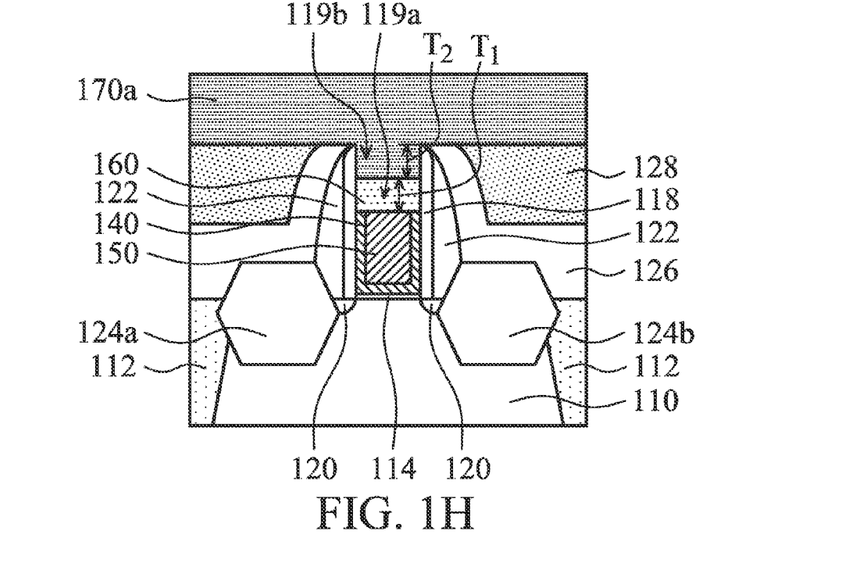

Afterwards, as shown in FIG. 1H, a second insulating material layer 170a is deposited over the semiconductor substrate 110 to fill the recess 119b, in accordance with some embodiments. The second insulating material layer 170a is in direct contact with the first insulating layer 160, in accordance with some embodiments.

The second insulating material layer 170a includes an insulating material with a high etch resistance, in accordance with some embodiments. For example, the second insulating material layer 170a includes a nitride material, such as silicon nitride (SiN). The second insulating material layer 170a is deposited by a chemical vapor deposition process, such as a plasma enhanced chemical vapor deposition (PECVD) process, in accordance with some embodiments.

The first insulating layer 160 has a first thickness $T_1$, and the second insulating material layer 170a in the recess 119b has a second thickness $T_2$. In some embodiments, a ratio of the first thickness $T_1$ to the second thickness $T_2$ is in a range from about 0.6 to about 1.5.

Figure 1I:
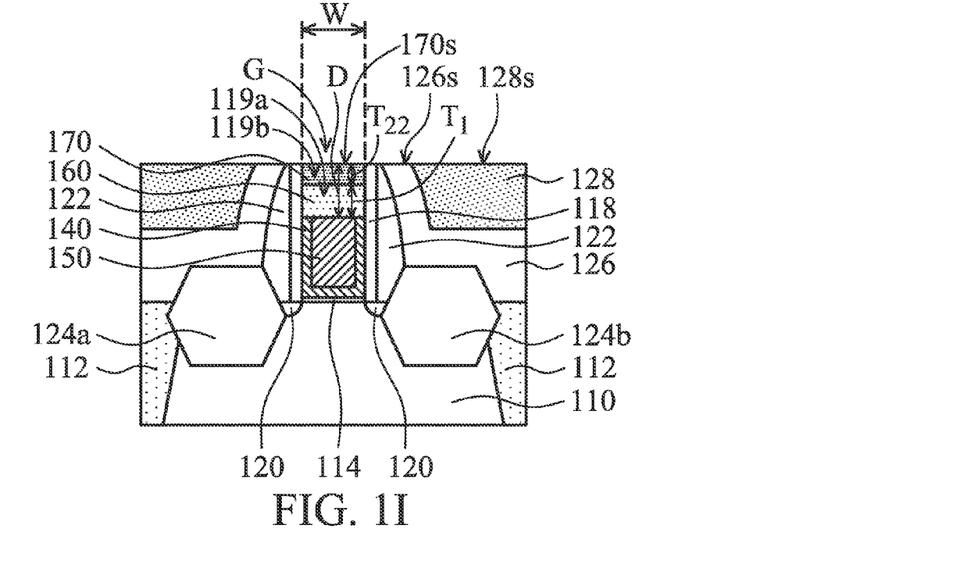

Thereafter, as shown in FIG. 1I, the second insulating material layer 170a outside of the recess 119a is removed. The second insulating material layer 170a remaining in the recess 119a forms a second insulating layer 170 in accordance with some embodiments. In some embodiments, the gate dielectric layer 114, the metal gate 150, the first insulating layer 160 and a second insulating layer 170 constitute a gate stack G. In some embodiments, the gate stack G further includes the work function metal layer 140.

In some embodiments, the first and the second insulating layers 160 and 170 are able to prevent the metal gate 150 from short-circuiting subsequently formed contact plugs which may be undesirably shifted. The contact plugs are used to electrically connect to the source stressor region 124a and the drain stressor region 124b, respectively. The first and the second insulating layers 160 and 170 may also be used to protect the metal gate 150 from being damaged in subsequent processes.

In some embodiments, the material of the second insulating layer 170 is different from that of the first insulating layer 160. The first insulating layer 160 has a higher gap-fill ability than that of the second insulating layer 170. Therefore, the first insulating layer 160 is also referred to as a filling layer. The second insulating layer 170 has a higher etch resistance than that of the first insulating layer 160. Therefore, the second insulating layer 170 is also referred to as a protection layer.

In some embodiments, the first insulating layer 160 with the high gap-fill ability fills a main portion of the recess 119a to reduce the aspect ratio of the recess 119b. Therefore, the second insulating material layer 170a (or the second insulating layer 170) may completely fills the recess 119b with a low aspect ratio. Therefore, even if the aspect ratio of the recess 119a is high, the first insulating layer 160 and the second insulating layer 170 may completely fill the recess 119a.

In some embodiments, the removal process also removes a portion of the second insulating material layer 170a originally in the recess 119b, portions of the sealing layer 118, the spacers 122, the contact etch stop layer 126 and the dielectric layer 128. Therefore, a thickness $T_{22}$ of the second insulating layer 170 is less than the second thickness $T_2$ of the second insulating material layer 170a in the recess 119b (as shown in FIG. 1H).

In some embodiments, the ratio ($T_1/T_{22}$) of the first thickness $T_1$ of the first insulating layer 160 to the thickness $T_{22}$ of the second insulating layer 170 is in a range from about 1 to about 3. In some embodiments, if the ratio ($T_1/T_{22}$) is less than 1 (i.e., the first insulating layer 160 is too thin), the second insulating layer 170 is unable to fill up the recess 119*b*. In some embodiments, if the ratio ($T_1/T_{22}$) is larger than 3 (i.e., the second insulating layer 170 is too thin), the second insulating layer 170 is easily damaged (or removed) by subsequent processes (such as a process for forming contact openings).

After the removal process, the depth D of the recess 119*a* is reduced, in accordance with some embodiments. Therefore, the aspect ratio of the recess 119*a* is reduced. For example, the aspect ratio of the recess 119*a* is in a range from about 0.6 to about 1.2.

In some embodiments, the removal process includes a planarization process, such as a chemical-mechanical polishing process. After the planarization process, a top surface 128*s* of the dielectric layer 128 is substantially coplanar with a top surface 170*s* of the second insulating layer 170, in accordance with some embodiments. In some embodiments, a top surface 126*s* of the contact etch stop layer 126, the top surface 128*s* of the dielectric layer 128 and the top surface 170*s* of the second insulating layer 170 are substantially coplanar with each other.

Figure 1J:
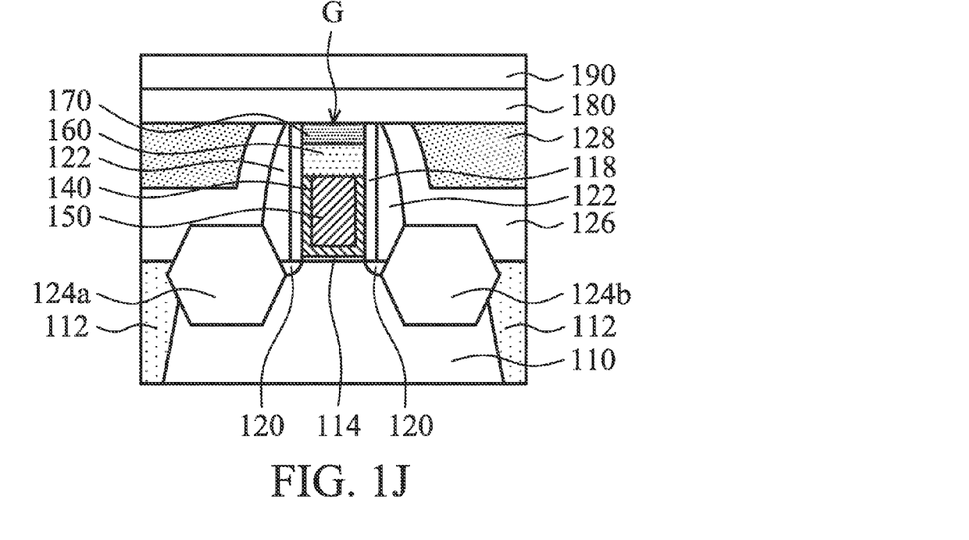

As shown in FIG. 1J, a contact etch stop layer 180 is deposited over the dielectric layer 128, the contact etch stop layer 126 and the gate stack G, in accordance with some embodiments. The contact etch stop layer 180 is made of silicon nitride or other suitable materials, in accordance with some embodiments.

As shown in FIG. 1J, a protective layer 190 is formed over the contact etch stop layer 180. The protective layer 190 is configured to protect the contact etch stop layer 180 from being damaged during a subsequent pre-amorphized implantation (PAI) process, in accordance with some embodiments. The protective layer 190 includes, for example, a plasma-enhanced oxide (PEOX) layer.

Figure 1K:
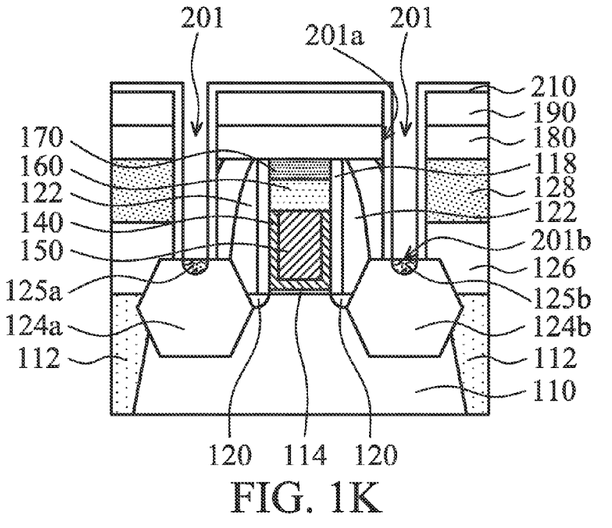

Afterwards, as shown in FIG. 1K, the protective layer 190, the contact etch stop layer 180, the dielectric layer 128 and the contact etch stop layer 126 are patterned to form contact openings 201, in accordance with some embodiments. The contact openings 201 expose the source stressor region 124*a* and the drain stressor region 124*b*, respectively. In some embodiments, a photolithography process and an etching process are used for patterning.

Thereafter, a dielectric spacer liner (DSL) layer 210 is conformally formed on the protective layer 190 and the sidewalls 201*a* of the contact openings 201, in accordance with some embodiments. The DSL layer 210 is configured to protect the sidewalls 201*a* from being damaged by a subsequent process, such as a pre-amorphized implantation (PAI) process. The DSL layer 210 is made of, for example, SiOC or other suitable materials. The DSL layer 210 is formed by, for example, an atomic layer deposition process or other suitable processes.

In some embodiments, a pre-amorphized implantation (PAI) process is performed to reduce the dopant channeling effect and enhance dopant activation. In some embodiments, silicon, germanium or carbon is used. In some other embodiments, inert gases, such as neon, argon, krypton, xenon, and/or radon, are used. Portions of the source stressor region 124*a* and the drain stressor region 124*b*, exposed and located at the bottoms 201*b* of the contact openings 201, are turned into an amorphous state as a result of the PAI process.

As shown in FIG. 1K, a salicidation (self-aligned silicidation) process is performed to form metal silicide regions 125*a* and 125*b* on/in the source stressor region 124*a* and the drain stressor region 124*b*, respectively, in accordance with some embodiments. The metal silicide regions 125*a* and 125*b* are made of nickel silicide.

In some embodiments, the metal silicide regions 125*a* and 125*b* are made of a silicide material of a suitable metal material. The suitable metal material may include cobalt (Co), nickel (Ni), platinum (Pt), titanium (Ti), ytterbium (Yb), molybdenum (Mo), erbium (Er), or combinations thereof. In some embodiments, the salicidation process is optional.

Figure 1L:
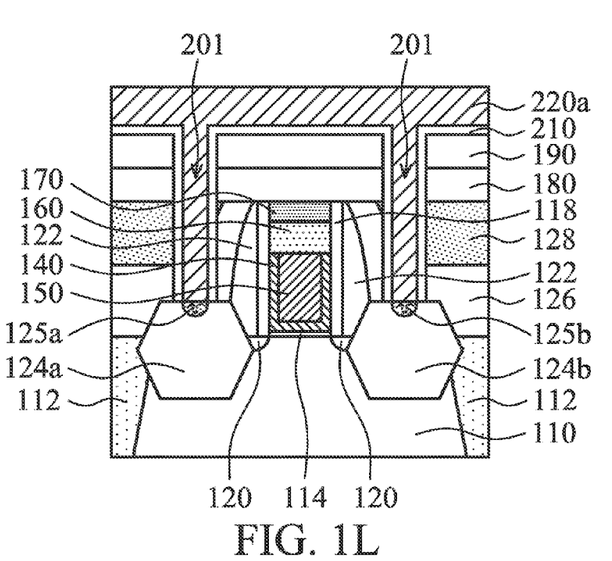

As shown in FIG. 1L, a conductive layer 220*a* is deposited over the protective layer 190 to fill the contact openings 201, in accordance with some embodiments. The conductive layer 220*a* connects to the metal silicide regions 125*a* and 125*b*. The conductive layer 220*a* is made of, for example, tungsten or other suitable conductive materials. The conductive layer 220*a* is formed by, for example, a PVD process, a plating process, a CVD process or other suitable processes.

Figure 1M:
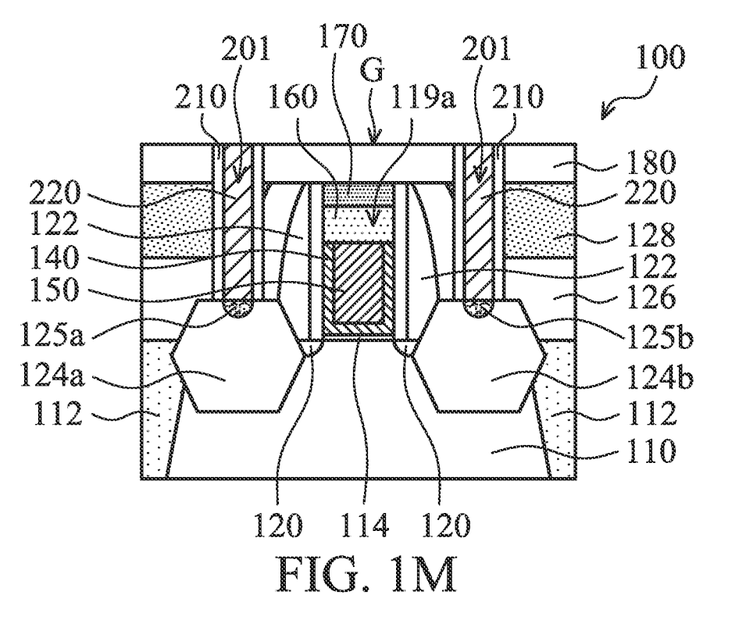

As shown in FIG. 1M, the conductive layer 220*a* and the DSL layer 210 outside the contact openings 201 and the protective layer 190 are removed, in accordance with some embodiments. The removal process includes, for example, a chemical mechanical polishing (CMP) process. After the removal process, the conductive layer 220*a* remaining in the contact openings 201 forms contact plugs 220. The contact plugs 220 are electrically connected to the source stressor region 124*a* and the drain stressor region 124*b* (i.e. the S/D regions).

As shown in FIG. 1M, a semiconductor device 100 is substantially formed. The semiconductor device 100 may be an n-type metal-oxide-semiconductor field-effect transistor (MOSFET) or a p-type MOSFET.

In accordance with some embodiments, semiconductor device structures and methods for forming the same are provided. A first insulating layer with a high gap-fill ability and a second insulating layer with a high etch resistance are sequentially formed in a recess surrounded by a metal gate and spacers to fill up the recess. The first insulating layer and the second insulating layer may prevent the metal gate from short-circuiting contact plugs which may be undesirably shifted.

In accordance with some embodiments, a semiconductor device structure is provided. The semiconductor device structure includes a semiconductor substrate. The semiconductor device structure further includes a gate stack over the semiconductor substrate. The gate stack includes a gate dielectric layer, a metal gate over the gate dielectric layer, a first insulating layer over the metal gate and a second insulating layer over the first insulating layer. Materials of the first insulating layer and the second insulating layer are different. The semiconductor device structure also includes spacers over opposite sidewalls of the gate stack. The spacers and the metal gate surround a recess, and the first insulating layer and the second insulating layer are in the recess.

In accordance with some embodiments, a semiconductor device structure is provided. The semiconductor device structure includes a semiconductor substrate. The semiconductor device structure further includes a gate stack over the semiconductor substrate. The gate stack includes a gate dielectric layer, a metal gate over the gate dielectric layer, a filling layer over the metal gate and a protection layer over the filling layer. A first thickness of the filling layer is greater than or equal to a second thickness of the protection layer. The semiconductor device structure also includes spacers over opposite sidewalls of the gate stack. The spacers and the metal gate surround a recess, and the filling layer and the protection layer are in the recess.

In accordance with some embodiments, a method for forming a semiconductor device structure is provided. The method for forming the semiconductor device structure includes forming two separated spacers over a semiconductor substrate. The method for forming the semiconductor device structure includes forming a metal gate between the spacers. The spacers and the metal gate surround a recess. The method for forming the semiconductor device structure includes forming a first insulating layer in the recess and over the metal gate. The method for forming the semiconductor device structure includes forming a second insulating layer in the recess and over the first insulating layer. Materials of the first insulating layer and the second insulating layer are different.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
   a semiconductor substrate;
   a gate stack over the semiconductor substrate, wherein the gate stack comprises a gate dielectric layer, a metal gate over the gate dielectric layer, a first insulating layer over the metal gate and a second insulating layer over the first insulating layer, materials of the first insulating layer and the second insulating layer are different, and the first insulating layer comprises an oxide material; and
   spacers over opposite sidewalls of the gate stack, wherein the spacers and the metal gate bound on a lateral side and a bottom side of a recess, and the first insulating layer and the second insulating layer are in the recess,
   wherein a first thickness of the first insulating layer measured from a top surface of the first insulating layer that is below a bottom of the second insulating layer to a bottom of the first insulating layer is greater than or equal to a second thickness of the second insulating layer measured from a top of the second insulating layer to the bottom of the second insulating layer.

2. The semiconductor device structure as claimed in claim 1, wherein a ratio of the first thickness to the second thickness is in a range from about 1 to about 3.

3. The semiconductor device structure as claimed in claim 1, wherein the first insulating layer and the second insulating layer completely fill the recess, the second insulating layer is entirely above the first insulating layer, and the second insulating layer occupies an entire top side of the recess.

4. The semiconductor device structure as claimed in claim 1, wherein the second insulating layer comprises a nitride material.

5. The semiconductor device structure as claimed in claim 1, further comprising:
   a dielectric layer over the semiconductor substrate and surrounding the spacers, wherein a first top surface of the dielectric layer is substantially coplanar with a second top surface of the second insulating layer.

6. The semiconductor device structure as claimed in claim 1, further comprising:
   a dielectric layer over the semiconductor substrate and surrounding the gate stack; and
   a contact etch stop layer over the dielectric layer and the gate stack.

7. The semiconductor device structure as claimed in claim 6, wherein a source region and a drain region are in the semiconductor substrate and adjacent to the spacers respectively, and the semiconductor device structure further comprises:
   a first contact plug passing through the contact etch stop layer and the dielectric layer to electrically connect to the source region; and
   a second contact plug passing through the contact etch stop layer and the dielectric layer to electrically connect to the drain region.

8. The semiconductor device structure as claimed in claim 1, wherein the first insulating layer is in direct contact with the metal gate.

9. The semiconductor device structure as claimed in claim 1, wherein the first insulating layer comprises silicon oxide.

10. A semiconductor device structure, comprising:
    a semiconductor substrate;
    a gate stack over the semiconductor substrate, wherein the gate stack comprises a gate dielectric layer, a metal gate over the gate dielectric layer, a filling layer over the metal gate and a protection layer over the filling layer, and a first thickness of the filling layer measured from a top surface of the filling layer that is below a bottom of the protection layer to a bottom of the filling layer is greater than or equal to a second thickness of the protection layer measured from a top of the protection layer to the bottom of the protection layer, wherein the filling layer is an electrically insulating layer and is in contact with the metal gate, the filling layer is made of a material different from the protection layer, and the filling layer comprises an oxide material; and
    spacers over opposite sidewalls of the gate stack, wherein the spacers and the metal gate bound on a lateral side and a bottom side of a recess, and the filling layer and the protection layer are in the recess.

11. The semiconductor device structure as claimed in claim 10, wherein a ratio of the first thickness to the second thickness is in a range from about 1 to about 3.

12. The semiconductor device structure as claimed in claim 10, further comprising:
    a dielectric layer over the semiconductor substrate and surrounding the gate stack, wherein a first top surface of the dielectric layer is substantially coplanar with a second top surface of the protection layer.

13. The semiconductor device structure as claimed in claim 10, wherein the protection layer comprises a nitride material.

14. The semiconductor device structure as claimed in claim 10, wherein the protection layer is in direct contact with the filling layer.

15. The semiconductor device structure as claimed in claim 10, wherein the filling layer and the protection layer completely fill the recess, the protection layer is entirely above the filling layer, and the protection layer occupies an entire top side of the recess.

16. The semiconductor device structure as claimed in claim 10, further comprising:

a dielectric layer over the semiconductor substrate and surrounding the gate stack; and a contact etch stop layer over the dielectric layer and the gate stack.

17. The semiconductor device structure as claimed in claim 16, wherein a source region and a drain region are in the semiconductor substrate and adjacent to the spacers respectively, and the semiconductor device structure further comprises:

a first contact plug passing through the contact etch stop layer and the dielectric layer to electrically connect to the source region; and a second contact plug passing through the contact etch stop layer and the dielectric layer to electrically connect to the drain region.

18. The semiconductor device structure as claimed in claim 10, wherein the filling layer is in direct contact with an entire top surface of the metal gate.

19. The semiconductor device structure as claimed in claim 10, wherein the filling layer is made of the material different from the spacers.

20. The semiconductor device structure as claimed in claim 10, wherein the filling layer comprises silicon oxide.

* * * * *